United States Patent (10) Patent No.: US 11,289,261 B2
Tsuchida et al. (45) Date of Patent: Mar. 29, 2022

(54) CIRCUIT ASSEMBLY

(71) Applicants: AUTONETWORKS TECHNOLOGIES, LTD., Yokkaichi (JP); SUMITOMO WIRING SYSTEMS, LIMITED, Yokkaichi (JP); SUMITOMO ELECTRIC INDUSTRIES, LTD., Osaka (JP)

(72) Inventors: Toshiyuki Tsuchida, Yokkaichi (JP); Shigeki Yamane, Yokkaichi (JP); Hirotoshi Maeda, Yokkaichi (JP); Takuya Ota, Yokkaichi (JP); Junya Aichi, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 584 days.

(21) Appl. No.: 16/081,753

(22) PCT Filed: Mar. 8, 2017

(86) PCT No.: PCT/JP2017/009159
§ 371 (c)(1),
(2) Date: Aug. 31, 2018

(87) PCT Pub. No.: WO2017/154954
PCT Pub. Date: Sep. 14, 2017

(65) Prior Publication Data
US 2019/0206604 A1 Jul. 4, 2019

(30) Foreign Application Priority Data

Mar. 9, 2016 (JP) .............................. JP2016-045283

(51) Int. Cl.
*H01F 27/02* (2006.01)
*H01F 27/06* (2006.01)
(Continued)

(52) U.S. Cl.
CPC ........... *H01F 27/08* (2013.01); *H01F 17/045* (2013.01); *H01F 27/02* (2013.01); *H01F 27/022* (2013.01);
(Continued)

(58) Field of Classification Search
CPC ........ H01F 27/08; H01F 27/02; H01F 17/045; H01F 27/022; H01F 27/2823;
(Continued)

(56) References Cited

U.S. PATENT DOCUMENTS 10,304,606 B2 * 5/2019 Aichi ...................... H01F 27/06
2017/0140863 A1 5/2017 Aichi et al.

FOREIGN PATENT DOCUMENTS

JP 2004-253508 A 9/2004
JP 2013125857 A * 6/2013
(Continued)

OTHER PUBLICATIONS

May 30, 2017 International Search Report issued in International Patent Application PCT/JP2017/009159.

*Primary Examiner* — Tuyen T Nguyen
(74) *Attorney, Agent, or Firm* — Oliff PLC

(57) ABSTRACT

A circuit assembly that includes an inductor including a core; a fixation member to which the inductor is fixed; a base that is attached to the core, wherein: the fixation member is made of a first material having a coefficient of thermal expansion larger than a coefficient of thermal expansion of the core, and the base is made of a second material having a coefficient of thermal expansion larger than the coefficient of thermal expansion of the core and smaller than the
(Continued)

coefficient of thermal expansion of the fixation member; and an adhesive layer that is disposed between the base and the fixation member, and that bonds the base and the fixation member together.

6 Claims, 6 Drawing Sheets

(51) Int. Cl.
*H01F 27/08* (2006.01)
*H01F 17/04* (2006.01)
*H01F 27/28* (2006.01)
*H01F 27/30* (2006.01)
*H05K 1/02* (2006.01)
*H05K 3/32* (2006.01)

(52) U.S. Cl.
CPC ......... *H01F 27/06* (2013.01); *H01F 27/2823* (2013.01); *H01F 27/306* (2013.01); *H05K 1/021* (2013.01); *H05K 3/321* (2013.01); *H01F 2017/046* (2013.01)

(58) Field of Classification Search
CPC .. H01F 27/306; H01F 27/06; H01F 2017/046; H05K 1/021; H05K 3/321
See application file for complete search history.

(56) References Cited

FOREIGN PATENT DOCUMENTS

| | | |
|---|---|---|
| JP | 2014-67787 A | 4/2014 |
| JP | 2015-201582 A | 11/2015 |
| JP | 2017-140863 A | 8/2017 |
| WO | 2016/002326 A1 | 1/2016 |

* cited by examiner

CIRCUIT ASSEMBLY

This application is the U.S. National Phase of PCT/JP2017/009159 filed Mar. 8, 2017, which claims priority from JP 2016-045283 filed Mar. 9, 2016, the entire disclosure of which is incorporated by reference.

BACKGROUND

The technique disclosed herein relates to a circuit assembly.

As a conventional structure that fixes an inductor to a fixation member, the one described in JP 2004-253508A is known. The document discloses a structure having a fixing hole formed in a circuit board as a fixation member, and also a fixing hole formed in an inductor. The structure fixes the inductor and the circuit board together in a state in which a fixation member such as a bolt or a rivet is inserted through the hole of the fixation member and the hole of the inductor.

SUMMARY

However, the above-described configuration requires a fixation member such as a bolt or a rivet, and thus poses the problem that the number of components is increased.

For this reason, it was contemplated to directly bond the inductor to the fixation member via an adhesive material. However, when the coefficient of thermal expansion of the component constituting the inductor and the coefficient of thermal expansion of the material constituting the fixation member are different, a stress resulting from the difference in the coefficient of thermal expansion will be applied to one of the component of the inductor and the fixation member if the inductor and the fixation member is heated in the bonded state. Then, there is a concern that a defect such as deformation of the component of the inductor, or the fixation member may occur. In particular, the core constituting the inductor is problematic in that it has a relatively small coefficient of thermal expansion, and thus is likely to be affected by a stress resulting from heating.

An exemplary aspect of the disclosure suppresses the stress applied to a core when a circuit assembly is heated.

A circuit assembly according to an exemplary aspect of the disclosure includes an inductor including a core; a fixation member to which the inductor is fixed; a base that is attached to the core, wherein: the fixation member is made of a first material having a coefficient of thermal expansion larger than a coefficient of thermal expansion of the core, and the base is made of a second material having a coefficient of thermal expansion larger than the coefficient of thermal expansion of the core and smaller than the coefficient of thermal expansion of the fixation member; and an adhesive layer that is disposed between the base and the fixation member, and that bonds the base and the fixation member together.

With the above-described configuration, the difference between the coefficient of thermal expansion of the fixation member and the coefficient of thermal expansion of the core can be absorbed by the base when the circuit assembly is heated. This makes it possible to suppress the stress applied to the core when the circuit assembly is heated.

As embodiments of the technique disclosed herein, the following embodiments are preferable.

In a preferable configuration, the inductor is housed in a case, and a bottom wall of the case forms the base.

With the above-described configuration, the number of components can be reduced than when the base and the case are formed by separate members.

In a preferable configuration, the base includes a leg protruding toward the fixation member, and the adhesive layer is formed in a gap formed between the base and the fixation member by the leg.

With the above-described configuration, the dimension of the gap between the base and the fixation member can be defined by the amount by which the leg protrudes from the base. Consequently, the adhesive layer can be formed uniformly, so that the base and the fixation member can be reliably bonded together.

In a preferable configuration, the leg includes a plurality of legs, at least one of the plurality of legs is formed as a positioning leg and the amount by which the positioning leg protrudes from a bottom face of the base is set to be larger than that of the other legs, and a positioning hole into which the positioning leg is inserted is formed in the fixation member at a position corresponding to the positioning leg.

With the above-described configuration, the inductor can be readily positioned to the fixation member by inserting the positioning leg into the positioning hole. This makes it possible to improve the manufacturing efficiency of the circuit assembly.

The adhesive layer may be made of a thermosetting adhesive.

To cure the thermosetting adhesive, it is necessary to heat the circuit assembly. The technique disclosed herein can be suitably used in such a case.

The fixation member may be a heat sink made of a metal.

With the above-described configuration, the heat generated in the circuit assembly can be efficiently transferred to the heat sink so as to be dissipated to the outside, thus making it possible to improve the heat dissipation performance of the circuit assembly.

When the fixation member to which the inductor is fixed is the heat sink made of a metal, the difference between the coefficient of expansion of the core and the coefficient of expansion of the heat sink that are caused by heating tends to be increased since a metal has a larger coefficient of thermal expansion than the core. In such a case, application of the technique disclosed herein makes it possible to effectively suppress the stress applied from the heat sink to the core.

The fixation member may be a glass epoxy substrate.

According to the technique disclosed herein, it is possible to suppress the stress applied to a core when a circuit assembly is heated.

DETAILED DESCRIPTION OF EMBODIMENTS

Embodiment 1

Figure 1:
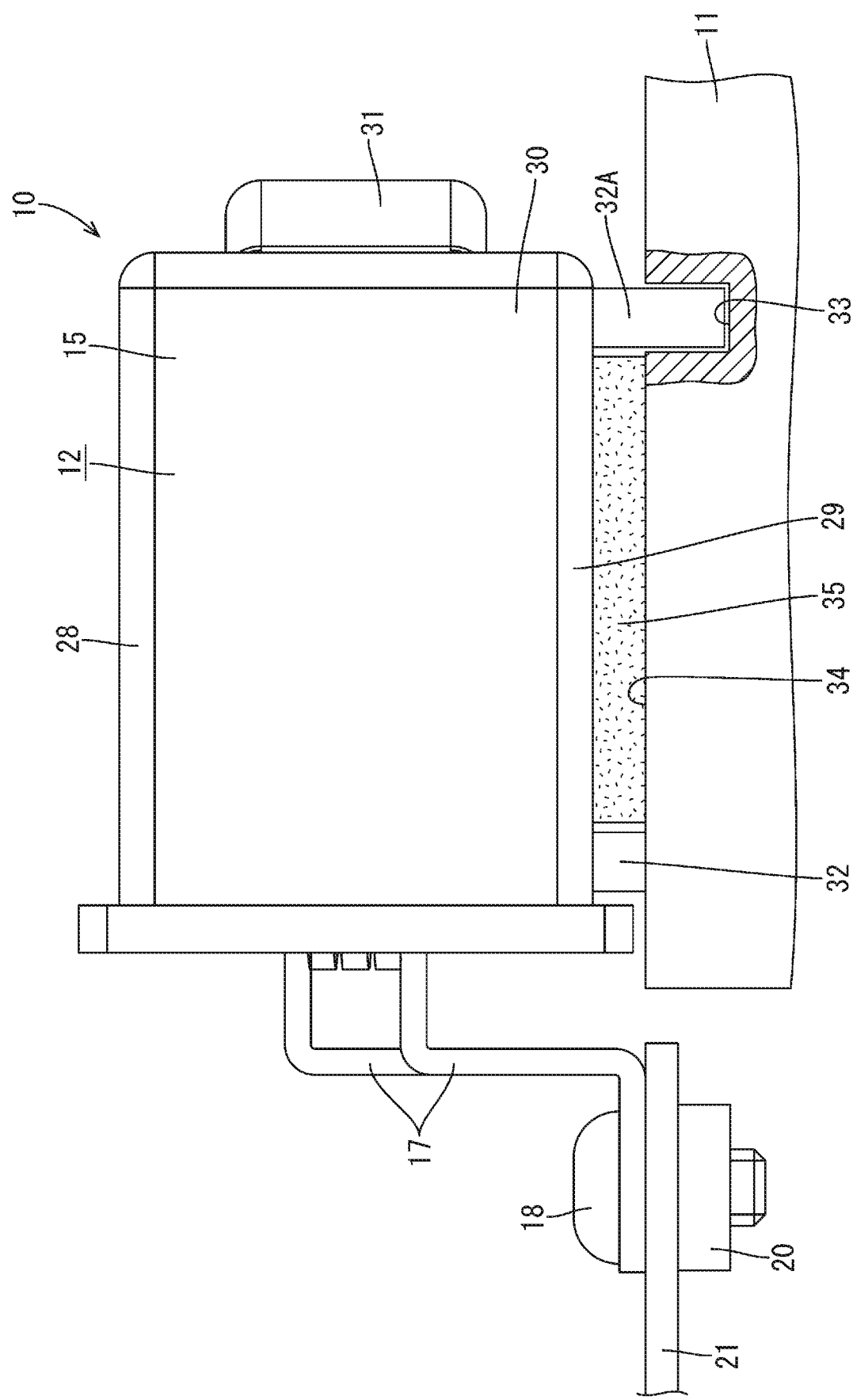
FIG. 1 is a partially cut-out side view showing a circuit assembly according to Embodiment 1.

Embodiment 1 of the technique disclosed herein will be described with reference to FIGS. 1 to 3. A circuit assembly 10 according to the present embodiment is mounted to a vehicle such as an electric car or a hybrid car, and is used as a DC/DC converter, for example. The following description is given, assuming that the X direction is the right direction, the Y direction is the front direction, and the Z direction is the upper direction.

The circuit assembly 10 includes a heat sink 11 (an example of the fixation member) and a coil device 12 (an example of the inductor) fixed to the heat sink 11 made of a metal. The coil device 12 can be used as a choke coil that smoothes the output voltage of the DC/DC converter, for example. The circuit assembly 10 may be configured to be housed in a housing (not shown).

As the metal (an example of the first material) constituting the heat sink 11, any metal such as aluminum, an aluminum alloy, copper, a copper alloy, or stainless steel may be selected as appropriate. In the present embodiment, aluminum or an aluminum alloy is used.

Coil Device 12

Figure 2:
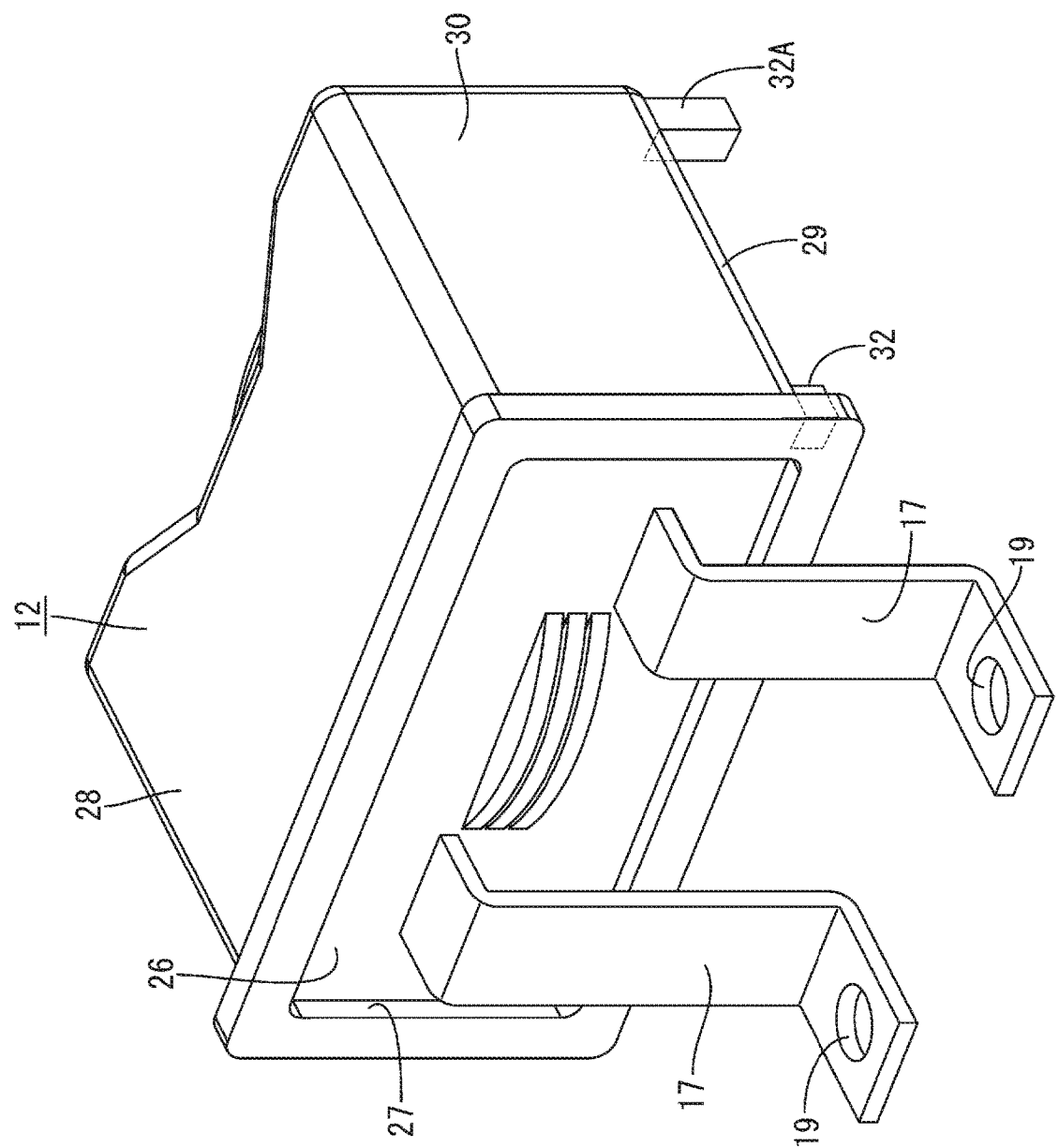
FIG. 2 is a perspective view showing a coil device.
Figure 3:
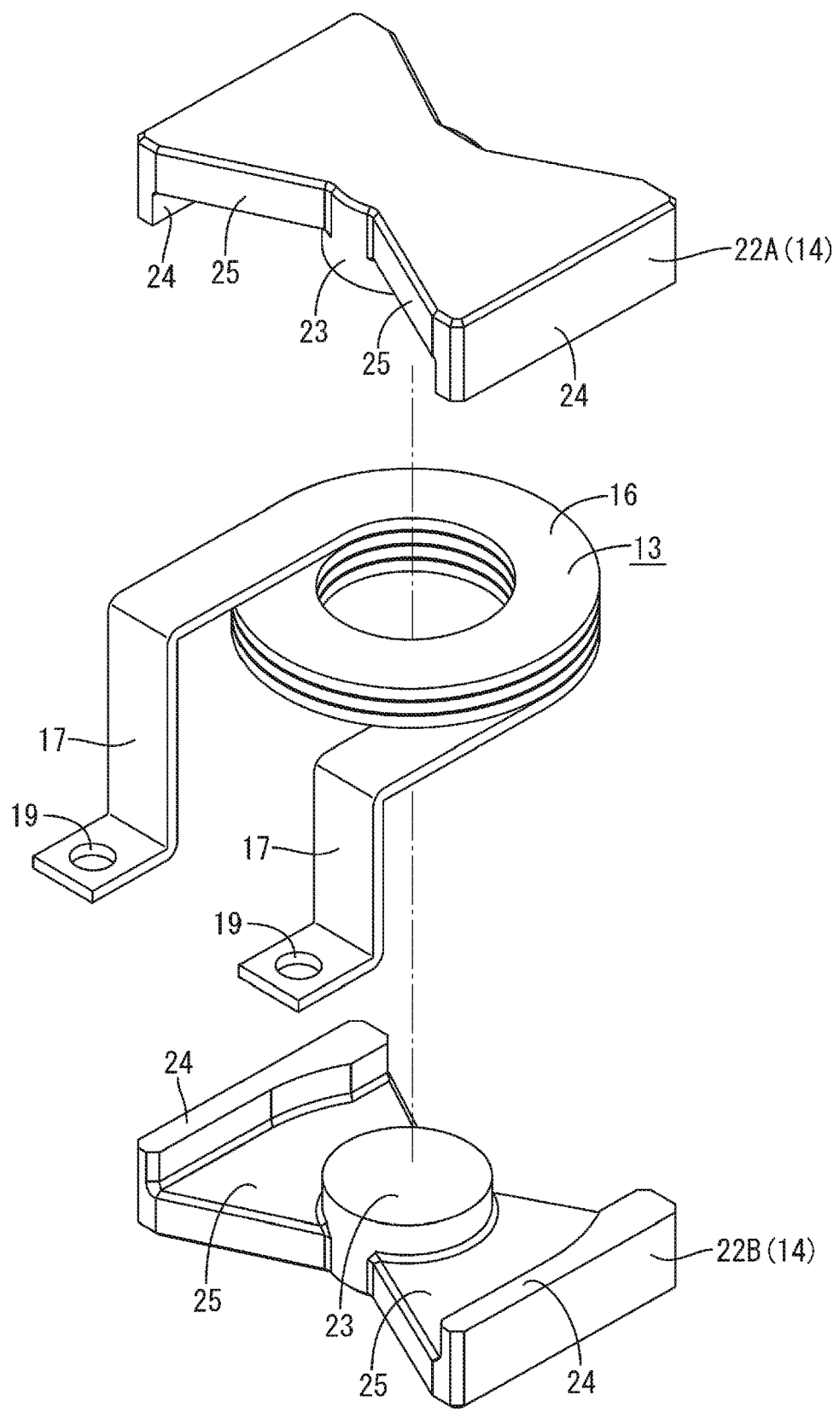
FIG. 3 is an exploded perspective view showing a coil and a core.

As shown in FIGS. 2 and 3, the coil device 12 includes a coil 13, a ferrite core 14 (an example of the core) of a magnetic material, and a case 15 that covers the coil 13 and the ferrite core 14.

Coil 13

As shown in FIG. 3, the coil 13 is a so-called edgewise coil, which is made of, for example, copper or a copper alloy, and is obtained by spirally winding a band-shaped flat rectangular wire having a flat rectangular cross section such that the shorter sides of the cross section constitute the inner radial surface and the outer radial surface, and is formed as a bare conductor with no coating such as enamel formed thereon. The coil 13 includes a plurality of annular turn portions (turns) 16, and a pair of terminal portions 17 that are connected to the outside. The plurality of turn portions 16 are identical in shape (have the same inner diameter and the same outer diameter), are arranged in a vertical direction, and the vertically adjacent turn portions 16 are connected in the circumferential direction. The plurality of turn portions 16 enable the coil 13 as a whole to be elastically deformable in the vertical direction.

The pair of terminal portions 17 are connected with each of the plurality of turn portions 16, and extend forward from the turn portions 16. The terminal portions 17 extend in the direction of the tangents of the inner circumference and the outer circumference of the turn portions 16, and are then bent downward in a crank shape.

At a distal end of each terminal portion 17, a circular connection hole 19 that allows insertion of the shaft portion of a bolt 18 extends through the terminal portion. The terminal portion 17 is connected to a counterpart terminal 21 by being fastened with a nut 20 to a connection hole (not shown) of the counterpart terminal 21 through the shaft portion of the bolt 18.

Ferrite Core 14

The ferrite core 14 is formed of a magnetic material having a high magnetic permeability, such as ferrite, and is configured by combining a pair of divisional members 22A and 22B. Each of the divisional members 22A and 22B includes a cylindrical column portion 23, side wall portions 24 having a curved inner face, and a plate-shaped connection support portion 25 that connects the column portion 23 with the side wall portions 24 and supports the coil 13. These portions are formed integrally. The divisional members 22A and 22B are assembled to the coil 13 from above and below the coil 13.

Case 15

The coil 13, the divisional portion 22A, and the divisional portion 22B are housed in the case 15. The inside of the case 15 is filled with a potting material 26. The coil 13, the ferrite core 14 (the divisional portion 22A and the divisional portion 22B) are fixed to the case 15 by the potting material 26.

The case 15 is made of a synthetic resin (an example of the second material), and has the shape of a box opened at the front by an opening 27, as shown in FIG. 2. More specifically, the case 15 includes an upper wall 28 and a bottom wall 29 extending along an upper face and a lower face of the coil 13, side walls 30 extending along left and right side faces of the coil 13, and a rear wall 31 extending along a rear face of the coil 13. Note that the bottom wall 29 of the case 15 is configured to be opposed to an upper face of the heat sink 11.

A plurality of leg portions 32 protruding downwardly toward the heat sink 11 are formed on the bottom wall 29 of the case 15. The plurality of leg portions 32 include one positioning leg portion 32A and the amount by which it protrudes from the bottom wall 29 is set to be larger than that of the other leg portions 32.

A positioning hole 33 into which the positioning leg portion 32A is inserted is formed vertically in the heat sink 11 at the position corresponding to the positioning leg portion 32A. The positioning hole 33 may be a bottomed-hole, or may be a through hole vertically extending all the way through the heat sink 11.

The outer face of the positioning leg portion 32A that is inserted into the positioning hole 33 is in abutment against the inner face of the positioning hole 33, and, thereby, the heat sink 11 and the case 15 are positioned in the direction extending along the plate surface of the heat sink 11.

As the synthetic resin constituting the case 15, any synthetic resin including, for example, a polyolefin such as polyethylene or polypropylene, a polyester such as polyethylene terephthalate or polybutylene terephthalate, or a polyamide such as nylon 6,6 or nylon 6 may be selected as appropriate. The synthetic resin may also be configured to include a given filler such as talc or glass fiber.

The lower ends of the leg portions 32 other than the positioning leg portion 32A are in abutment against the upper face of the heat sink 11 from above, and, thereby, a gap 34 is formed between the bottom wall 29 of the case 15 and the heat sink 11. An adhesive layer 35 is formed inside the gap 34.

The bottom wall 29 of the case 15 and the upper face of the heat sink 11 are bonded together by the adhesive layer 35. In the present embodiment, a thermosetting adhesive is used as the adhesive constituting the adhesive layer 35. As the thermosetting adhesive, any thermosetting adhesive such as an epoxy resin, an acrylic resin, or a silicone resin may be used as appropriate.

Coefficient of Thermal Expansion

The coefficient of thermal expansion of the ferrite core 14 according to the present embodiment is $9\times10^{-6}$ to $10\times10^{-8}$ [° C.]. The coefficient of thermal expansion of the heat sink 11 according to the present embodiment is $20\times10^{-6}$ to $25\times10^{-6}$ [° C.]. The coefficient of thermal expansion of the case 15 according to the present embodiment is $12\times10^{-6}$ to $18\times10^{-6}$ [° C.].

Thus, the coefficient of thermal expansion of the case 15 according to the present embodiment is larger than the coefficient of thermal expansion of the ferrite core 14, and smaller than the coefficient of thermal expansion of the heat sink 11.

Operation and Effects of the Embodiment

Next, the operation and effects of the present embodiment will be described. A circuit assembly 10 according to the present embodiment includes a coil device 12 including a ferrite core 14 and a heat sink 11 to which the coil device 12 is fixed, and that is made of a material having a coefficient of thermal expansion larger than the coefficient of thermal expansion of the ferrite core 14. A case 15 made of a material having a coefficient of thermal expansion larger than the coefficient of thermal expansion of the ferrite core 14, and smaller than the coefficient of thermal expansion of the heat sink 11 is attached to the ferrite core 14. An adhesive layer 35 that bonds the case 15 and the heat sink 11 together is disposed between the case 15 and the heat sink 11.

With the above-described configuration, the difference between the thermal expansion of the heat sink 11 and the thermal expansion of the ferrite core 14 can be absorbed by the case 15 when the circuit assembly 10 is heated. This makes it possible to suppress the stress applied to the ferrite core 14 when the circuit assembly 10 is heated.

The ferrite core 14 has a relatively small coefficient of thermal expansion. On the other hand, the aluminum (or aluminum alloy) constituting the heat sink 11 has a larger coefficient of thermal expansion than the ferrite core 14. Accordingly, when the circuit assembly 10 is heated, a stress resulting from deformation of the heat sink 11 will be applied to the ferrite core 14. Additionally, the ferrite core 14 is relatively brittle, and, therefore, there is a concern that the ferrite core 14 may be cracked or chipped by the stress resulting from deformation of the heat sink 11. The technique disclosed herein can be suitably used when stress is applied to the ferrite core 14.

According to the present embodiment, the coil device 12 is housed inside the case 15, and a bottom wall 29 of the case 15 is bonded to the heat sink 11 via the adhesive layer 35.

With the above-described configuration, the number of components can be reduced more than when the member for fixing the heat sink 11 and the case 15 are formed by separate members.

According to the present embodiment, the case 15 includes a leg portion 32 protruding toward the heat sink 11, and the adhesive layer 35 is formed in a gap 34 formed between the case 15 and the heat sink 11 by the leg portion 32.

With the above-described configuration, the size of the gap 34 between the case 15 and the heat sink 11 can be defined by the amount by which the leg portions 32 protrude from the bottom wall 29 of the case 15. Consequently, the adhesive layer 35 can be formed to have a uniform thickness, so that the case 15 and the heat sink 11 can be reliably bonded together.

According to the present embodiment, there are a plurality of leg portions 32, and at least one of the plurality of leg portions 32 is formed as a positioning leg portion 32A and the amount by which the positioning leg portion 32A protrudes from the bottom face of the case 15 is set to be larger than that of the rest f the leg portions 32, and a positioning hole 33 into which the positioning leg portion 32A is inserted is formed in the heat sink 11 at a position corresponding to the positioning leg portion 32A.

With the above-described configuration, the coil device 12 can be readily positioned to the heat sink 11 by inserting the positioning leg portion 32A into the positioning hole 33.

This makes it possible to improve the manufacturing efficiency of the circuit assembly 10.

According to the present embodiment, the adhesive layer 35 is made of a thermosetting adhesive.

To cure the thermosetting adhesive, it is necessary to heat the circuit assembly 10. The technique disclosed herein can be suitably used in such a case.

According to the present embodiment, the coil device 12 is fixed to the heat sink 11 made of a metal.

With the above-described configuration, the heat generated in the circuit assembly 10 can be efficiently transferred to the heat sink 11 so as to be dissipated to the outside, thus making it possible to improve the heat dissipation performance of the circuit assembly 10.

When the fixation member to which the coil device 12 is fixed is the heat sink 11 made of a metal, the difference between the coefficient of expansion of the ferrite core 14 and the coefficient of expansion of the heat sink 11 that are caused by heating tends to be increased since a metal has a larger coefficient of thermal expansion than the ferrite core 14. In such a case, application of the technique disclosed herein makes it possible to effectively suppress the stress applied from the heat sink 11 to the ferrite core 14.

Modification 1

Figure 4:
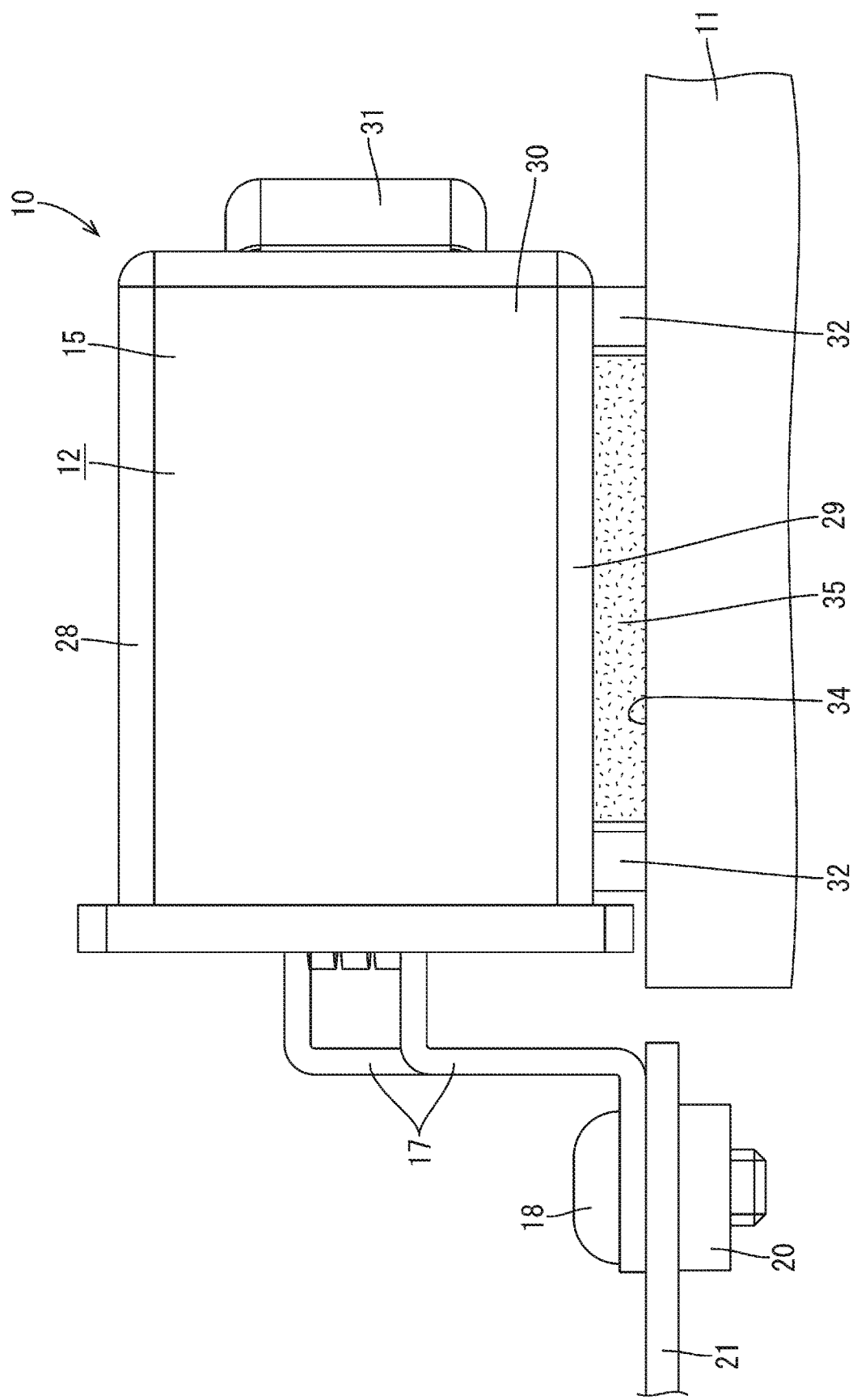
FIG. 4 is a side view showing a circuit assembly according to Modification 1.

Next, Modification 1 according to Embodiment 1 will be described with reference to FIG. 4. In the present modification, the positioning leg portion 32A has been omitted. The rest of the configuration is substantially the same as that of Embodiment 1, and, therefore, the same members are denoted by the same reference numerals, and redundant descriptions thereof have been omitted.

A plurality of leg portions 32 and an upper face of a heat sink 11 are in abutment against each other, and, thereby, a gap 34 is formed between a bottom wall 29 of a case 15 and an upper face of the heat sink 11. An adhesive layer 35 is formed in the gap 34.

Modification 2

Figure 5:
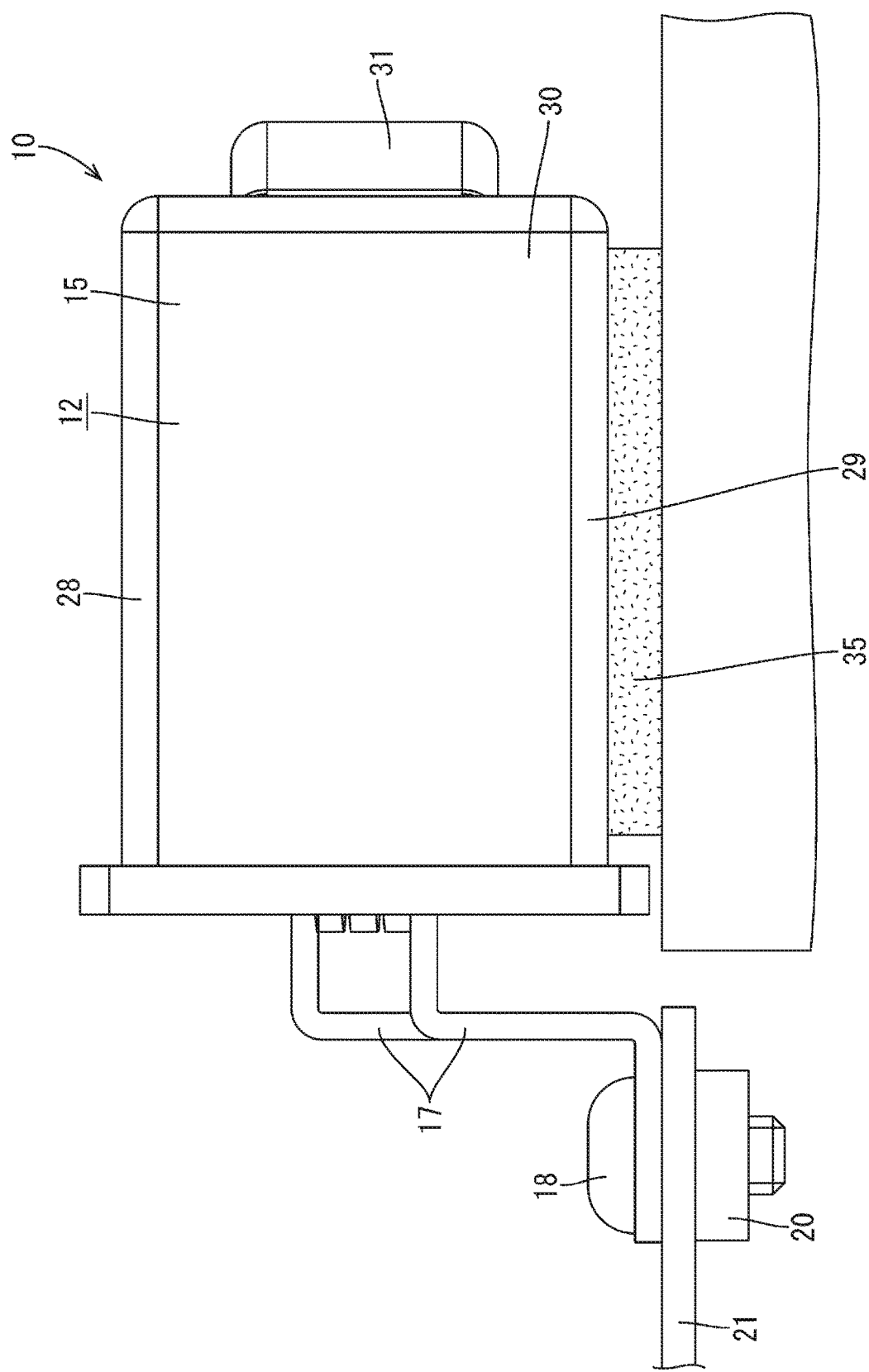
FIG. 5 is a side view showing a circuit assembly according to Modification 2.

Next, Modification 2 according to Embodiment 1 will be described with reference to FIG. 5. In the present modification, the leg portions 32 and the positioning leg portion 32A have been omitted. The rest of the configuration is substantially the same as that of Embodiment 1, and, therefore, the same members are denoted by the same reference numerals, and redundant descriptions thereof have been omitted.

An adhesive layer 35 is formed between a bottom wall 29 of a case 15 and an upper face of a heat sink 11, and the case 15 and the heat sink 11 are fixed together by the adhesive layer 35.

Modification 3

Figure 6:
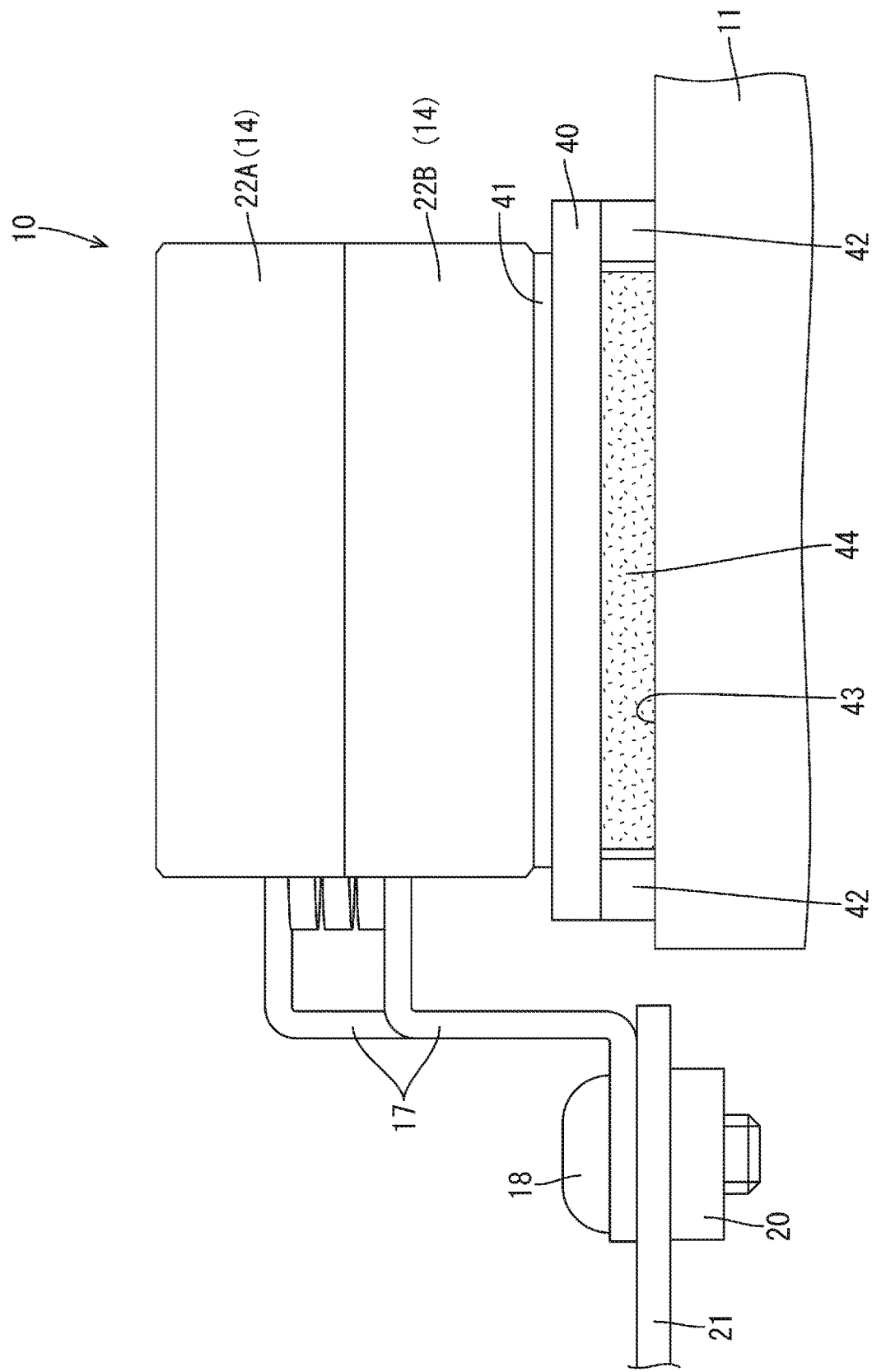
FIG. 6 is a side view showing a circuit assembly according to Modification 3.

Next, Modification 3 according to Embodiment 1 will be described with reference to FIG. 6. In the present modification, the case 15 has been omitted. A lower face of a divisional member 22A, 22B of a ferrite core 14 is fixed to an upper face of a plate-shaped base portion 40 made of a synthetic resin. The divisional members 22A and 22B and the base portion 40 are bonded together via a secondary adhesive layer 41.

A plurality of leg portions 42 protruding downwardly toward a heat sink 11 are formed on a lower face of the base portion 40. The lower face of the leg portion 42 and an upper face of the heat sink 11 are in abutment against each other, and, thereby, a gap 43 is formed between the base portion 40 and the heat sink 11. The base portion 40 and the heat sink 11 are fixed in the gap 43 by a primary adhesive layer 44 (an example of the adhesive layer).

The rest of the configuration is substantially the same as that of Embodiment 1, and, therefore, the same members are denoted by the same reference numerals, and redundant descriptions thereof have been omitted.

According to the present modification, the size of the coil device 12 can be reduced than when the case 15 is provided.

Other Embodiments

The technique disclosed herein is not limited to the embodiment described above by way of the description and the drawings. For example, the following embodiments also fall within the technical scope of the technique disclosed herein.

(1) Although the inductor is the coil device 12 in the present embodiment, the inductor is not limited thereto, and may also be a transformer.

(2) Although the fixation member is the heat sink 11 in the present embodiment, the fixation member is not limited thereto, and may also be a circuit board (an example of the glass epoxy substrate). Alternatively, the fixation member may be a bus bar made of a metal.

(3) Although the adhesive layer 35 is made of a thermosetting adhesive in the present embodiment, the adhesive layer 35 is not limited thereto, and may also be formed by a room temperature curing adhesive.

(4) Although a ferrite core is used as the core in the present embodiment, the material constituting the core is not limited thereto, and may also be selected from any magnetic material such as a metal as appropriate.

The invention claimed is:

1. A circuit assembly comprising:
an inductor including a core;
a fixation member to which the inductor is fixed;
a base that is attached to the core and that includes a leg protruding toward the fixation member, wherein:
the fixation member is made of a first material having a coefficient of thermal expansion larger than a coefficient of thermal expansion of the core, and
the base is made of a second material having a coefficient of thermal expansion larger than the coefficient of thermal expansion of the core and smaller than the coefficient of thermal expansion of the fixation member; and
an adhesive layer that is disposed between the base and the fixation member, that is formed in a gap formed between the base and the fixation member by the leg, and that bonds the base and the fixation member together.

2. The circuit assembly according to claim 1, wherein the inductor is housed in a case, and
a bottom wall of the case forms the base.

3. The circuit assembly according to claim 1, wherein the leg includes a plurality of legs,
at least one of the plurality of legs is formed as a positioning leg, and the amount by which the positioning leg protrudes from a bottom face of the base is larger than that of the other legs, and
a positioning hole into which the positioning leg is inserted is formed in the fixation member at a position corresponding to the positioning leg.

4. The circuit assembly according to claim 1, wherein the adhesive layer is made of a thermosetting adhesive.

5. The circuit assembly according to claim 1, wherein the fixation member is a heat sink made of a metal.

6. The circuit assembly according to claim 1, wherein the fixation member is a glass epoxy substrate.

* * * * *